United States Patent [19]

Figueiredo et al.

[11] Patent Number: 5,718,593
[45] Date of Patent: Feb. 17, 1998

[54] POLARITY-SENSITIVE PROTECTOR DEVICE

[75] Inventors: Antonio Albino Figueiredo, Belleville; Adam Stuart Kane, Morristown, both of N.J.

[73] Assignee: Lucent Technologies Inc., Murray Hill, N.J.

[21] Appl. No.: 497,969

[22] Filed: Jul. 3, 1995

[51] Int. Cl.⁶ .................................................. H02H 1/04
[52] U.S. Cl. ............................... 439/76.1; 361/119
[58] Field of Search ................ 439/76.1; 361/119, 361/124

[56] References Cited

U.S. PATENT DOCUMENTS

| | | | |
|---|---|---|---|
| 4,171,857 | 10/1979 | Forberg et al. | 439/922 |
| 4,283,103 | 8/1981 | Forberg et al. | 439/922 |
| 5,157,580 | 10/1992 | Hegner et al. | 361/119 |
| 5,299,088 | 3/1994 | Hönl et al. | 361/119 |
| 5,549,489 | 8/1996 | Baggett et al. | 439/922 |
| 5,575,689 | 11/1996 | Baggett et al. | 439/709 |
| 5,596,475 | 1/1997 | Figueirdo et al. | 361/119 |
| 5,643,014 | 7/1997 | Filus et al. | 439/680 |

*Primary Examiner*—Neil Abrams

[57] ABSTRACT

Disclosed is a voltage and current protector device designed for insertion in connecting blocks. The current and voltage protection elements of the protector are mounted on a printed circuit board which has a conductive pattern on both major surfaces such that the elements can be mounted on either surface and the lead portion of the circuit board of the protector device can be inserted into the top or bottom surface slot of a connecting block depending upon which surface the elements are mounted.

6 Claims, 4 Drawing Sheets

POLARITY-SENSITIVE PROTECTOR DEVICE

BACKGROUND OF THE INVENTION

This invention relates to current and/or voltage protectors for inserting into a connecting block.

Connecting blocks are used in telecommunications systems for providing electrical connection between incoming and outgoing cables at central offices and other locations and to provide a cross-connection capability. Such connecting blocks also normally include voltage and current limiting protection devices to prevent damage to the circuits connected to the block. (See, e.g., U.S. Pat. Nos. 4,171,857 and 4,283,103 issued to Forberg et al.)

The protectors usually include a voltage surge protector element, such as a gas tube, current limiting devices, such as positive temperature coefficient (PTC) resistors, a ground electrode, and some form of thermal overload protection. The elements are typically mounted on a printed circuit board. (See, e.g., U.S. Pat. No. 5,299,088 issued to Hönl et al.)

Protector devices which provide both current and voltage protection are polarity sensitive with respect to the individual pairs of contacts in the connecting block since the voltage surge protector element should be electrically between the current protection element and the wires of the cables going outside the facility. This creates a problem with recently-proposed connecting blocks which can mount protectors on two surfaces, i.e., a protector is either adapted for mounting on the top or bottom surface, but not both, otherwise the arrangement of the protector elements will not be correct. This problem is dealt with by providing certain features on the block and protector to ensure that an individual protector can only be inserted on the proper surface of the block. (See, U.S. Pat. No. 5,643,014 of Figueiredo et al., issued Jul. 1, 1997, and assigned to the present assignee.)

A problem remains, however, in the expense of requiring two separate protectors to be manufactured for insertion in the top and bottom surfaces.

SUMMARY OF THE INVENTION

The invention is a protector device including a housing and adapted for insertion into a connecting block. The device includes a voltage protection element and a current protection element mounted on one surface of a printed wiring board which includes two major surfaces and a portion extending outside the housing for insertion into the block. The circuit board comprises a plurality of conductive through-holes for mounting the voltage protection element and the current protection element and conductive paths coupled to selected through-holes on both surfaces of the board and arranged to carry current first to the voltage protection element regardless of which major surface the voltage and current protection elements are mounted.

BRIEF DESCRIPTION OF THE DRAWING

These and other features of the invention are delineated in detail in the following description. In the drawing.

It will be appreciated that, for purposes of illustration, these figures are not necessarily drawn to scale.

DETAILED DESCRIPTION

Figure 1:
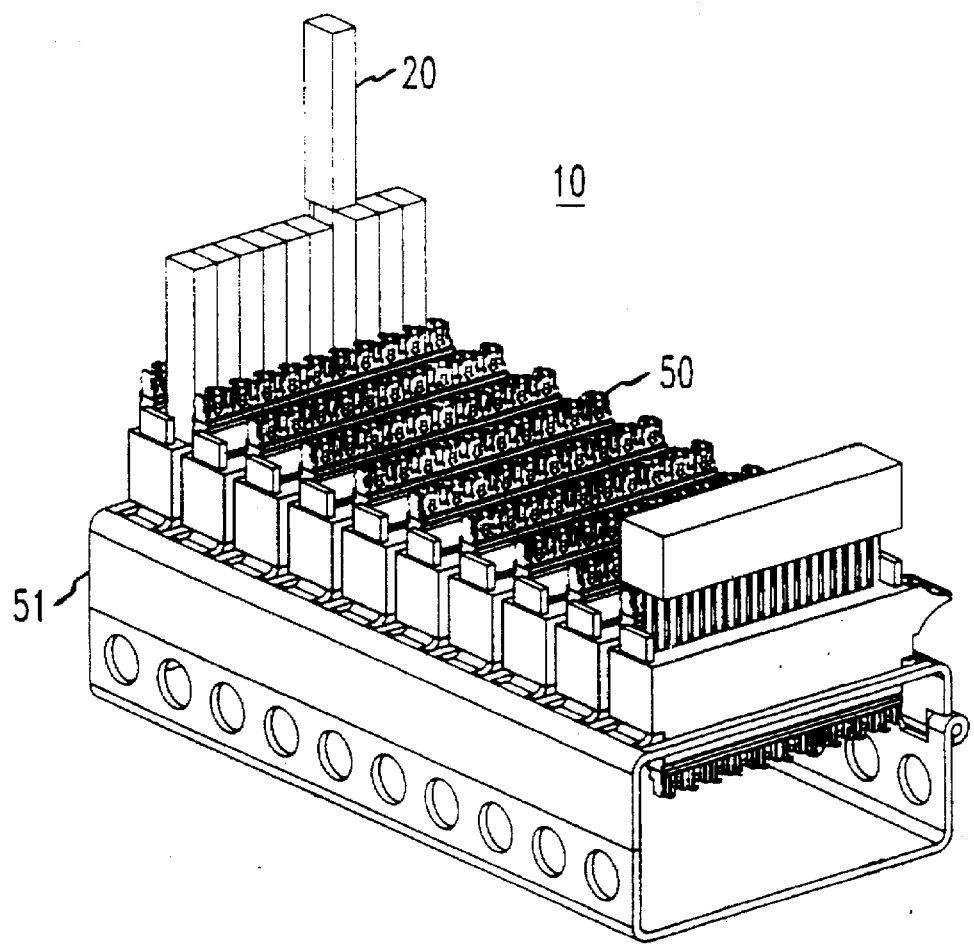
FIG. 1 is a perspective view of a connecting block including protector devices in accordance with an embodiment of the invention.
Figure 2:
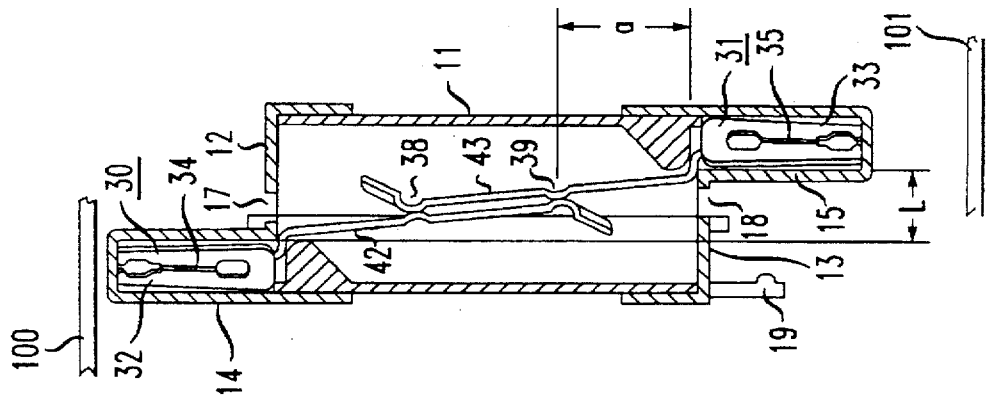
FIG. 2 is a cross-sectional view of a portion of the connecting block of FIG. 1.

FIGS. 1 and 2 illustrate one type of connecting block, 10, which may utilize the protector devices, e.g., 20, in accordance with the invention. The connecting blocks are described in more detail in U.S. Pat. Nos. 5,575,689 and 5,549,489 of Baggett et al., issued Nov. 19, 1996 and Aug. 29, 1996 respectively, and Figueiredo et al., U.S. Pat. No. 5,643,014; issued Jul. 1, 1997, which are incorporated by reference herein.

The connecting block, 10, includes a plurality of connector modules, e.g., 50, which are inserted into a hinged mounting bracket, 51. As illustrated in FIG. 2, each module includes an insulating housing having a rectangular-shaped body portion, 11, with insulating caps, 14 and 15, a portion of which defines a top surface, 12, and bottom surface, 13, respectively. A row of insulation displacement contacts, e.g., 30, extends through the top surface, 12, and a row of insulation displacement contacts, e.g., 31, extends through the bottom surface, 13. Each contact, 30 and 31, includes an end portion, 32 and 33, protruding through the surface, the end portions having an insulation-piercing slit, 34 and 35. Each end portion, 32 and 33, is capable of receiving a wire, 100 and 101, for purposes of providing electrical connection thereto. In this example, wire 101 is part of a cable coming into the central office from the outside. Each contact also includes a stem portion, 42 and 43, which is housed in the body portion, 11, and makes contact with a corresponding contact in the other row, desirably, at two points, 38 and 39, to electrically connect the wires, 100 and 101, coupled to corresponding contacts, 30 and 31, in the two rows.

Figure 3:
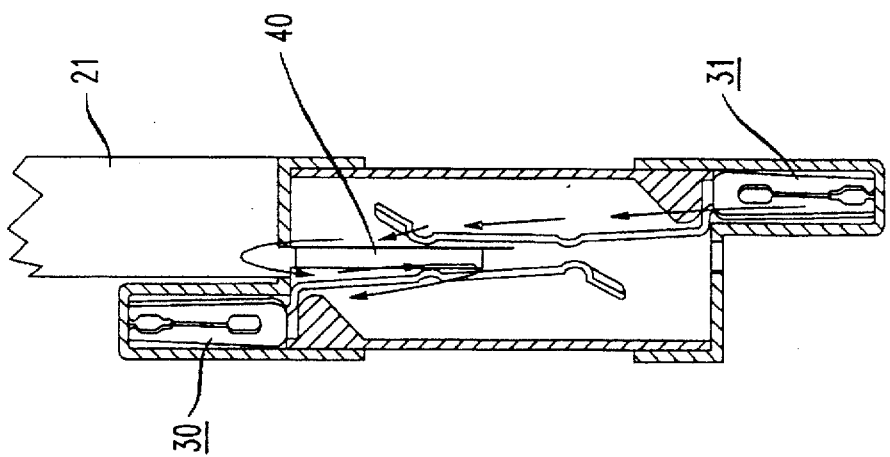
FIG. 3 is a cross-sectional view of the same portion of the connecting block including a protector device inserted into the top surface therein.
Figure 7:
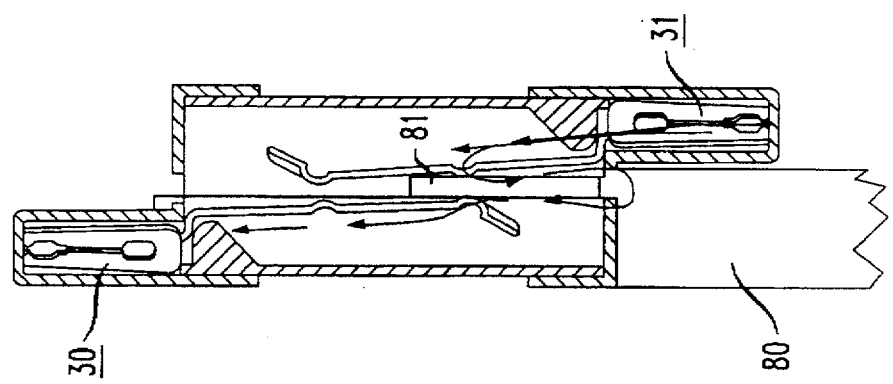
FIG. 7 is a cross-sectional view of the same portion of the connecting block of FIG. 1 including a protector device inserted into the bottom surface.

The contact points, 38 and 39, are aligned with respective slots, 17 and 18, in the top and bottom surfaces, 12 and 13, to permit insertion of leads from protectors or other elements mounted on the top or bottom surfaces. For example, FIG. 1 shows a row of protector devices, 20, in accordance with the invention mounted to the top surface of the block, while FIG. 3 illustrates a single protector device, 21, mounted to the top surface of the block and FIG. 7 illustrates a single protector device, 80, mounted to the bottom surface. It will be noted that the protectors, 21 and 80, are electrically connected to the stem portions of the two contacts, 30 and 31, as well as to the two adjacent contacts (not shown) in the row by means of leads, 40 and 81, which have their two major surfaces insulated from each other so that current is forced to flow through the protector devices in the manner illustrated by the arrows. Further, the protector devices are electrically coupled to a ground bar, e.g., 19 of FIG. 2, on the surface of the block so that excess current and voltage can be diverted to ground.

Figure 4:
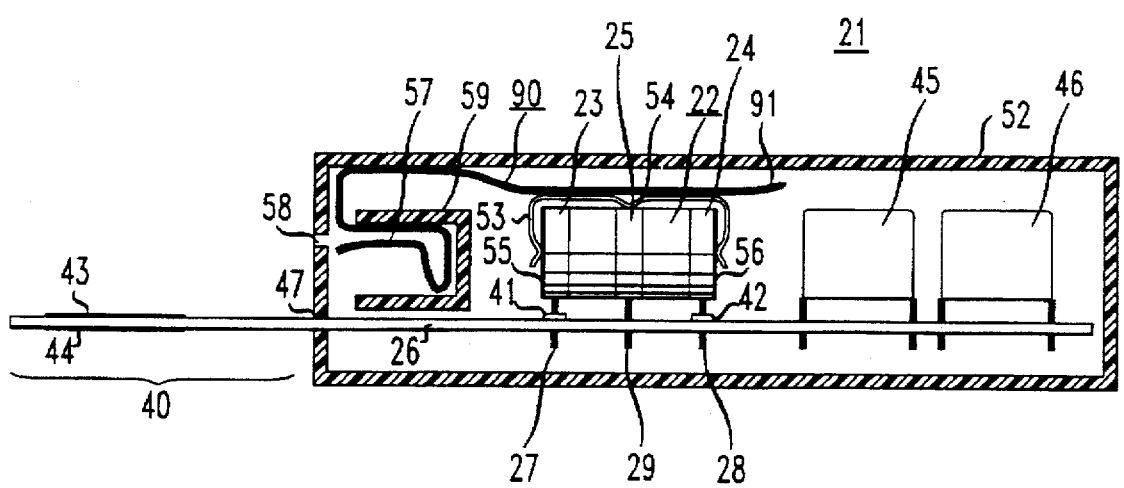
FIG. 4 is a cross-sectional view of a protector device in accordance with an embodiment of the invention.

As illustrated in FIG. 4, the protector, e.g., 21, in accordance with one embodiment includes a voltage surge protector element, 22, such as a standard gas tube protector. The element, 22, includes a pair of biasing electrodes, 23 and 24, at either end of the tube, and a ground electrode, 25, at the center. The tube is through-hole mounted to a printed circuit board, 26, by soldering pins, 27–29, connected to the tube electrodes, 23–25, respectively. The pins, 27 and 28, connected to the biasing electrodes, 23 and 24, are electrically coupled to conductive pads, 41 and 42, on the circuit board so that the electrodes are electrically coupled to the contact pads, e.g., 43 or 14, on the lead portion, 40, which are on the surface of the circuit board, 26. The pin, 29, coupled to the ground electrode, 25, however, is electrically isolated from other components or conductive paths on the board.

The voltage surge protector element, 22, is electrically coupled in series to a pair of positive temperature coefficient (PTC) resistors, 45 and 46, which are also through-hole mounted by soldering to the printed circuit board, 26. The surge protector element, 22, and PTC resistors, 45 and 46, are protected by an insulating housing, 52, such as plastic, which encloses those components and a portion of the board, 26. A portion, 40, of the board, 26, previously referred to as the lead portion, protrudes through an opening, 47, in the housing, 52, to permit insertion of said lead portion into the connecting block as illustrated in FIG. 3.

Attached to the surge protector element, 22, is a generally C-shaped conductive clamp, 53. The center of the clamp, 53, includes a dimpled portion, 54, which makes electrical contact with the ground electrode, 25. The ends of the clamp are in mechanical contact with insulating layers, 55 and 56, which are deposited on the biasing electrodes, 23 and 24, respectively. The insulating layers, 55 and 56, are preferably made of a material such as Mylar®, which has a melting point of less than 260 degrees C. with a thickness in the range 0.025 to 0.076 min. The clamp is attached to the element, 22, by spot welding.

Electrically coupled to the clamp, 53, is a ground connector, 90, which can be a thin metallic sheet having approximately the same width as the housing, 52. For example, the connector, 90, can be made of beryllium-copper with a thickness in the range 0.25 to 0.5 mm. The sheet is shaped to form an arcuate portion, 91, at one end which contacts the clamp, 53, and is also wedged between the clamp and the housing, 52. The other end of the sheet is shaped into a detent, 57, which is aligned with an opening, 58, in the housing, 52, so that when the lead, 40, is inserted into the connecting block as shown in FIG. 3, the detent, 57, will receive and hold the ground bar, 19 of FIG. 2, with a "clicking" noise so that the craftsperson knows the protector device is fully inserted.

During normal operation, current will be conducted in the direction illustrated in FIGS. 3 and 7 for devices inserted in the top and bottom surfaces, respectively, with the surge protector element, 22, being non-conductive. Excess current will be prevented by the changing resistance of the PTC resistors in accordance with known techniques. When the voltage appearing on the biasing electrodes, 23 and 24, reaches a threshold value, the tube, 22, will conduct current to the ground electrode 25, through the clamp, 53, and the connector, 90, to the ground bar, 19, of the connecting block so that protection from voltage surges is provided. It will be appreciated that in the usual protector device, excess voltage would be shunted through the ground pin, 29. However, applicants have discovered that by electrically isolating the ground pin and providing the ground path through connector 90 instead, the circuit board, 26, can be made narrower (typically 6.1 mm) so that the device can fit within the connecting module, 50, having very narrow spaces between adjacent contacts.

Further, in the event of thermal overload, the insulating films, 55 and 56, will melt, thereby bringing the ends of the C-shaped clamp into contact with the biasing electrodes 23 and 24. Since the clamp is coupled to ground through the connector, 90, the entire device would be short circuited, preventing any thermal damage to the circuits coupled to the connecting block. Since the connector, 90, acts to prevent both excess voltage and thermal overload, again, the protector device can be made smaller.

Figure 5:
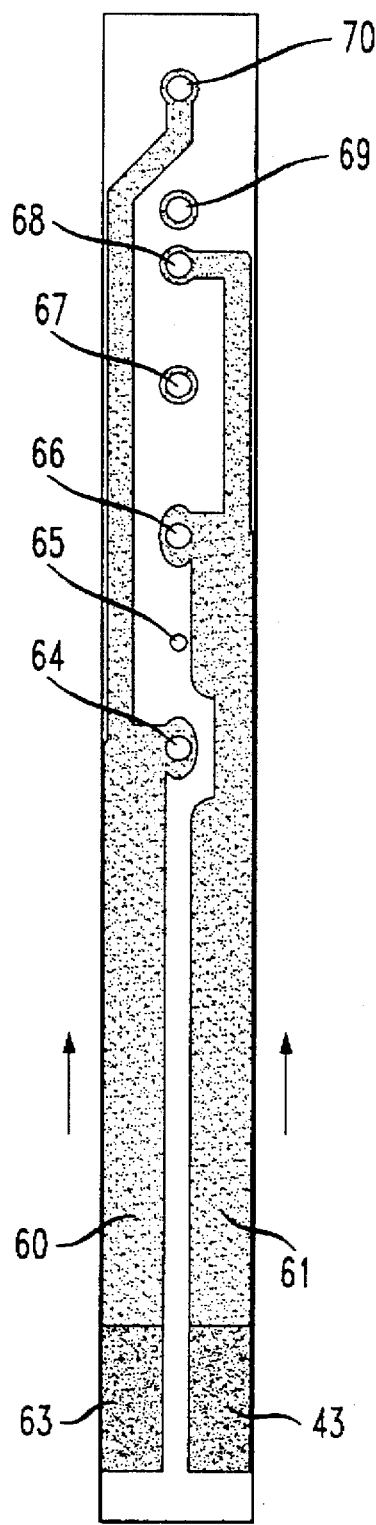
FIGS. 5 and 6 are plan views of opposite surfaces of a printed circuit board which is part of the protector device of FIG. 4.
Figure 6:
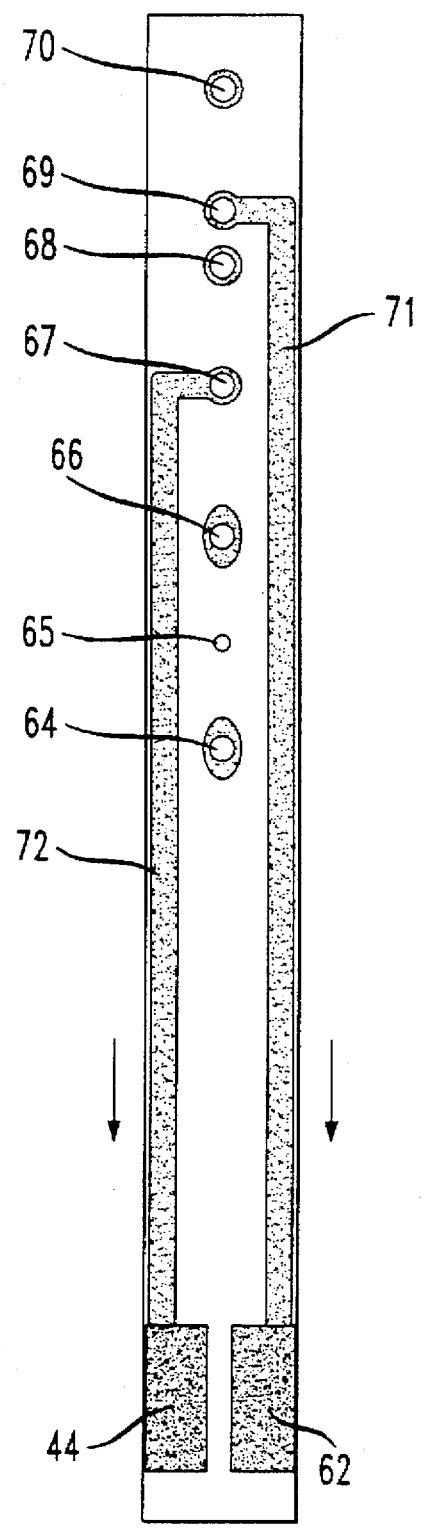

FIGS. 5 and 6 show the top and bottom surfaces, respectively, of the printed circuit board, 26, illustrating a feature of the invention. In FIG. 5, the components shown in FIG. 4 have been omitted for the sake of illustration. The top surface includes two conductive paths, 60 and 61, running along opposite edges of the board. The paths can be formed by standard deposition techniques and are usually made of copper. The paths 60 and 61, terminate at the insertion end of the board in contact pads, 63 and 43, which are usually made of gold plated copper. The board also includes seven through-holes, 64–70, at approximately the center line of the board. These holes can also be formed by standard techniques. One path, 60, extends to and through two of the holes, 64 and 70, while the other path, 61, extends to and through two other holes, 66 and 68. Holes, 64 and 66, are designed to receive therein the pins, 27 and 28, respectively, coupled to the biasing electrodes, 23 and 24, of the voltage surge protector element, 22, while hole 65, receives the pin, 29, coupled to the Found electrode, 25. Holes, 67 and 68, receive the pins of PTC resistor 45, while holes, 69 and 70 receive the pins of PTC resistor 46.

On the opposite surface of the board, as shown in FIG. 6, are two additional conductive paths, 71 and 72. Conductive path 71 extends along an edge of the surface from hole 69 to a pad, 62, at the insertion end of the board, while conductive path 72 extends along the opposite edge from hole 67 to a pad, 44, at the insertion end. It will be appreciated that paths 71 and 72 are electrically isolated from holes 64, 65 and 66.

In the normal operation, when the device, 21, is inserted in the top surface of the connecting block as shown in FIG. 3, current will flow from contact 31 (assuming this is the contact coupled to the outside plant cable) through pad 63 and path 60 to hole 70 and through resistor 46. Current flow then continues down path 71 to pad 62 and through contact 30. A similar current flow will occur from the contact adjacent to contact 31 (not shown) through path 61, resistor, 45, and path 72 on the opposite surface to another contact (not shown) adjacent to contact 30.

An important point to notice is that the the voltage protection element, 22, should be between the resistors, 45 and 46, and the outside plant cable to ensure that those resistors are protected. Thus, the device, 21, as shown can only be inserted in the top surface of the connecting block. A different circuit layout is required for devices which may be inserted into the bottom surface of the block. However, the cost of producing two different types of devices is reduced by the layout of the two surfaces of the board which permits the same board to be used for both polarities of devices. For a device having an opposite polarity than that shown, all that is needed is to mount the components on the opposite surface (FIG. 6).

Thus for a device, 80, having a polarity which is suited for mounting on the bottom surface of the connecting block as illustrated in FIG. 7, current will flow from contact 31 to pad 43 and through path 61 in the same direction as that shown in FIG. 5 through hole 68 to one pin of resistor 45 which is now mounted on the surface of FIG. 6. Current continues through the other pin of resistor 45 through hole 67, down path 72 in the same direction as to that shown in FIG. 6 to pad 44 and through contact 30. Similarly, the current path from the adjacent pair of contacts (not shown) will be along path 60, through resistor 46 and down path 71 in the same direction as that shown in FIGS. 5 and 6. Since the pins of voltage protection element are electrically connected to through-holes 64 and 66 which are electrically coupled to paths 60 and 61 the voltage protection element is still electrically between the resistors 45 and 46 and the outside cable coupled to contact 31.

The invention claimed is:

1. A protector device adapted for insertion into either a to surface or a bottom surface of a connecting block depending upon which surface of a printed circuit board a voltage protection element and a current protection element are mounted on comprising:

a housing;

a printed circuit board at least partially enclosed by said housing and including two major surfaces and a portion extending outside the housing; and a voltage protection element and a current protection element mounted to one surface of the printed circuit board;

the printed circuit board including a plurality of conductive through-holes for mounting the voltage protection element and the current protection element in the same position with respect to the printed circuit board regardless of whether they are mounted on the top surface or the bottom surface, and conductive paths coupled to selected through-holes on both surfaces of the board and arranged so as to carry current first to the voltage protection element regardless of which major surface of the printed circuit board the voltage protection element and current protection element are mounted.

2. The device according to claim 1 wherein the conductive paths on both surfaces are formed on two edges of the printed circuit board and the through-holes are formed in an area between the two paths on both surfaces.

3. The device according to claim 1 wherein the through-holes for mounting the voltage protection element are electrically coupled to conductive paths on only one surface of the board.

4. The protector device of claim 1 wherein the voltage protection element includes a pin-out coupled to a ground electrode wherein said pin-out is electrically isolated and a separate ground path is provided through an external connector connected to the ground electrode whereby the printed circuit board can be made narrower so that the protector device can fit within a connecting block having very narrow spaces between adjacent contacts.

5. The protector device of claim 4 wherein said external connector further comprises a clamp having ends which clamp into contact with insulating films on biasing electrodes on ends of the voltage protection element and a middle portion which makes the connection to the ground electrode whereby in the event of a thermal overload the insulating films will melt thereby bringing the ends of the clamp into contact with the biasing electrodes short circuiting the protector device and preventing any further thermal damage.

6. The protector device of claim 1 wherein the housing has symmetrical holes to allow the portion extending outside the housing to be flipped around for top or bottom mounting.

* * * * *